United States Patent [19]

Miller et al.

[11] Patent Number: 4,572,368
[45] Date of Patent: Feb. 25, 1986

[54] TOTE BOX

[75] Inventors: Daniel R. Miller; Albert J. McGlasson, both of Cincinnati, Ohio

[73] Assignee: Buckhorn Material Handling Group, Inc., Milford, Ohio

[21] Appl. No.: 756,316

[22] Filed: Jul. 18, 1985

[51] Int. Cl.[4] .......................... B65D 73/02; B65D 6/34
[52] U.S. Cl. ...................................... 206/328; 220/73; 220/23.86; 220/22; 206/334
[58] Field of Search .................. 220/4 R, 4 F, 1.5, 73, 220/84, 80, 23.83, 23.2, 23.86, 22; 206/334, 328

[56] References Cited

U.S. PATENT DOCUMENTS

| | | | |
|---|---|---|---|
| 2,139,618 | 12/1938 | Hall | 220/4 R |
| 2,598,962 | 6/1952 | Anseele | 220/73 |
| 2,671,239 | 3/1954 | Wisner | 220/22 |
| 3,233,644 | 2/1966 | Bono | 220/73 |
| 3,358,725 | 12/1967 | Bussard et al. | 220/73 |
| 3,419,182 | 12/1968 | Gildart | 220/73 |
| 3,920,144 | 11/1975 | Callen | 220/22 |
| 3,989,157 | 11/1976 | Veenema | 220/4 F |
| 4,102,557 | 7/1978 | Lee et al. | 220/4 F |
| 4,349,117 | 9/1982 | Bain et al. | 220/4 F |

Primary Examiner—Joseph Man-Fu Moy
Attorney, Agent, or Firm—Beall Law Offices

[57] ABSTRACT

One or a series of different size tote boxes may be extended in height by securely fastening a ring on top of it or them, which ring is preferably snapped to the top of the box by opposing hook-shaped tabs or interlocking elements. The ring is of a height to effectively change the height of the box, and if a series of different height boxes are involved, the height of the ring is such as to change a lower height box into a higher box of a size not to be found in the series. By effectively constructing the top of the ring in a manner similar to the top of the box, with respect to interlocking, rings may be stacked one upon another to increase the height of the boxes. Interior partitioning, particularly for circuit boards, is such that spacing between boards may be readily changed in a secure manner. Slotted circuit board holders have edges for insertion in opposed vertical slots, which edges are offset with respect to the plane of symmetry of such holders so that the holder may be removed, rotated 180° about a vertical axis and reinserted to provide for a change in spacing less than the spacing between slots in which the board holder is inserted.

20 Claims, 15 Drawing Figures

TOTE BOX

BACKGROUND OF THE INVENTION

Synthetic resin molded tote boxes have many well known uses, and according to such usage, they come in various sizes. For each different size, molds or tooling are needed, additional inventory is needed, and generally multiple sizes increase the cost of the product to the customer who buys and uses such boxes.

Many such boxes come with partitions, including some partitioned to receive circuit boards for handling within the factory or for shipping. Since circuit boards come in many different sizes, shapes and requirements for packaging, it is necessary to change sizes of the boxes as mentioned above and/or change the size and spacing of the partitions within such box. In the packaging of circuit boards, they should be packaged as close as practical, to conserve shipping space, but with the change in board dimensions that have been rapidly and frequently in the electronics industry, such partitioned boxes must be used for circuit boards for which they were not designed, which results in inefficient shipping due to the limitations of the partitioning, there are large spaces between circuit boards that are unnecessary from a packaging point of view and wasteful of space.

SUMMARY OF THE PRESENT INVENTION

It is an object of the present invention to construct an otherwise conventional synthetic resin molded tote box, or a series of different size boxes, with an extension ring for extending the height of such box or boxes without requiring the production and inventory of a different size box or different size boxes.

It is also an object of the present invention to provide for tote box partitioning, particularly for circuit boards, so that the flexibility of accommodating different size circuit boards may be increased for overall packaging efficiency.

In general, it is an object to make tote boxes more versatile in their accommodation of different sized articles to be held in them, in a more economic manner than has been the practice to date.

One or a series of different size tote boxes may be extended in height by securely fastening a ring on top of it or them, which ring is preferably snapped to the top of the box by opposing hook-shaped tabs or interlocking elements. The ring is of a height to effectively change the height of the box, and if a series of different height boxes are involved, the height of the ring is such as to change a lower height box into a higher box of a size not to be found in the series. By effectively constructing the top of the ring in a manner similar to the top of the box, with respect to interlocking, rings may be stacked one upon another to increase the height of the boxes. The interconnection of the rings or ring in box is such as to be secure, but also temporary so that the ring may be removed and reused.

Interior partitioning, particularly for circuit boards, is such that spacing between boards may be readily changed in a secure manner. A particular feature is such that slotted circuit board holders have edges for insertion in opposed vertical slots, which edges are offset with respect to the plane of symmetry of such holders so that the holder may be removed, rotated 180° about a vertical axis and reinserted to provide for a change in spacing less than the spacing between slots in which the board holder is inserted.

BRIEF DESCRIPTION OF A PREFERRED EMBODIMENT

Further objects, features and advantages of the present invention will become more clear from the following detailed description of a preferred embodiment of the present invention, wherein.

DESCRIPTION OF A PREFERRED EMBODIMENT

Figure 14:
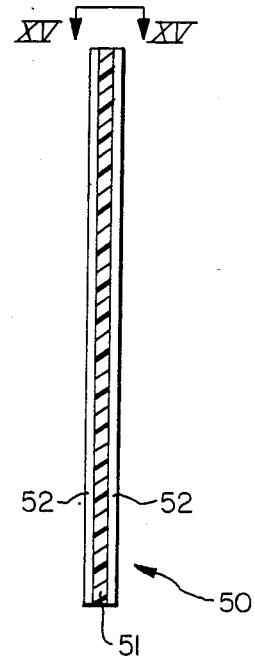
FIG. 14 is a cross-sectional view taken along line XIV—XIV in FIG. 13.
Figure 13:
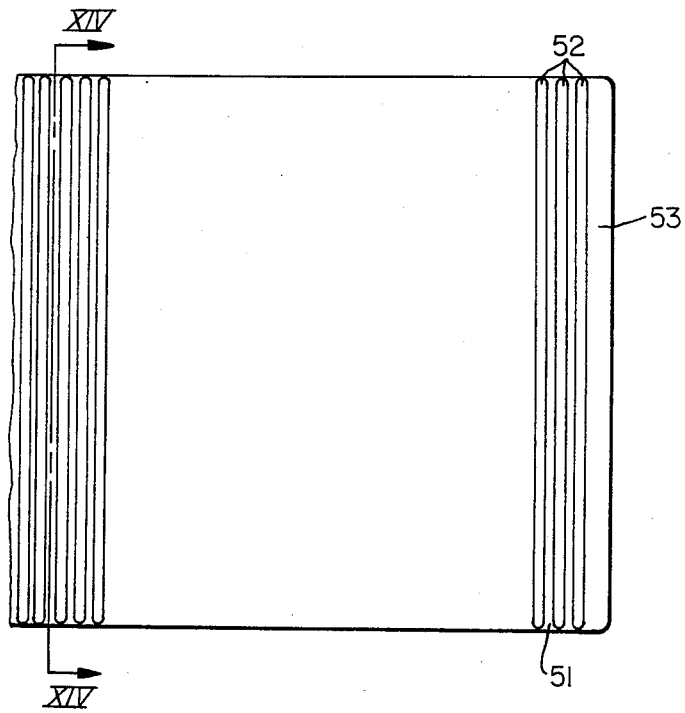
FIG. 13 is a side elevational view of one half of a circuit board holder, with the other half being substantially identical.

The base box of FIGS. 1, 2, 3 and 8 may be extended in size vertically with the ring extension of FIGS. 4, 5, 6 and 7. Either the base box, or as extended, may be partitioned with two partition plates, one of which is shown in FIGS. 9, 10, 11 and 12, and a suitable plurality of board holders shown in FIGS. 13-15. All of these components are preferably constructed of synthetic resin material, such as any of the well known injection molding compositions. For use with circuit boards, these components are preferably constructed of a resin that is electrically conducted, as is conventional.

Figure 3:
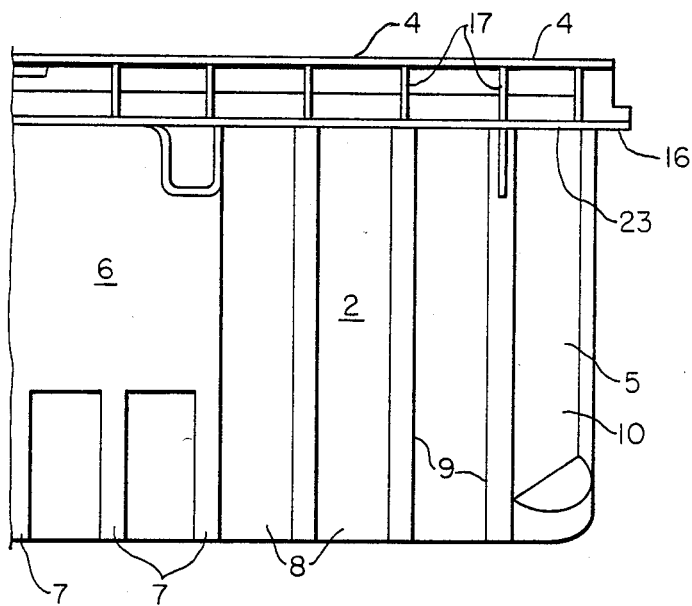
FIG. 3 is an end elevational view of the box portion of FIG. 1.

The base box is entirely in one piece, being molded. The base box includes a planar bottom 1, opposed ends 2, opposed sides 3, and a top edge structure 4. The sides and ends are generally vertical, preferably sloping upwardly and outwardly from the bottom. The sides and ends are respectively connected at their side edges to each other and at their lower edges. Slanting corners 5 are provided for such connections between adjacent sides and ends. The end wall, as shown in FIG. 3, is provided with a plain planar portion 6, which may be roughened to receive writing, or may have attached to it some label, or the like, to provide desired information. Outer web portions 7 of the ends are in the same plane as the portion 6, and for the side walls or sides, the outer webs 7 are in an outer plane. Inner webs 8 are coplanar with each other for each of the sides and ends, which planes are parallel to the adjacent planes of the outer webs 7. Connecting webs 9 interconnect adjacent inner and outer webs, to thereby form inwardly opening slots 11 for both the sides and ends. For the planar portions of the sides and ends, at 6, the slots 11 are formed by parallel inward extending ribs 12.

The top edge structure 4 is formed by a horizontal flange 13 interconnecting the top edges of the webs 7, 8, 9. The outer edge of the horizontal flange 13 is connected to the lower edge of vertical flange 14, which in turn is connected at its upper edge with a top horizontal flange pointed to more specifically by the lead line to the numeral 4 that indicates the top edge structure in general. The outermost edge of this flange is in turn connected, for portions of the periphery, to a downwardly dependent skirt flange 15. At other portions of the periphery, there is a horizontal corner flange 16 coextensive with an end flange 23, which flanges are interconnected by reinforcing ribs 17. In the top horizontal flange, there are a plurality of recesses 18 having therein indicia aligned with corresponding slots 11, for purposes of identification.

Interlocking elements are respectively provided on the base box and extension ring for interconnecting the same. With respect to the base box, the interlocking elements are indicated with respect to portions 19-22, which will be described in more detail, particularly with respect to their function associated with the now to be described ring.

Figure 4:
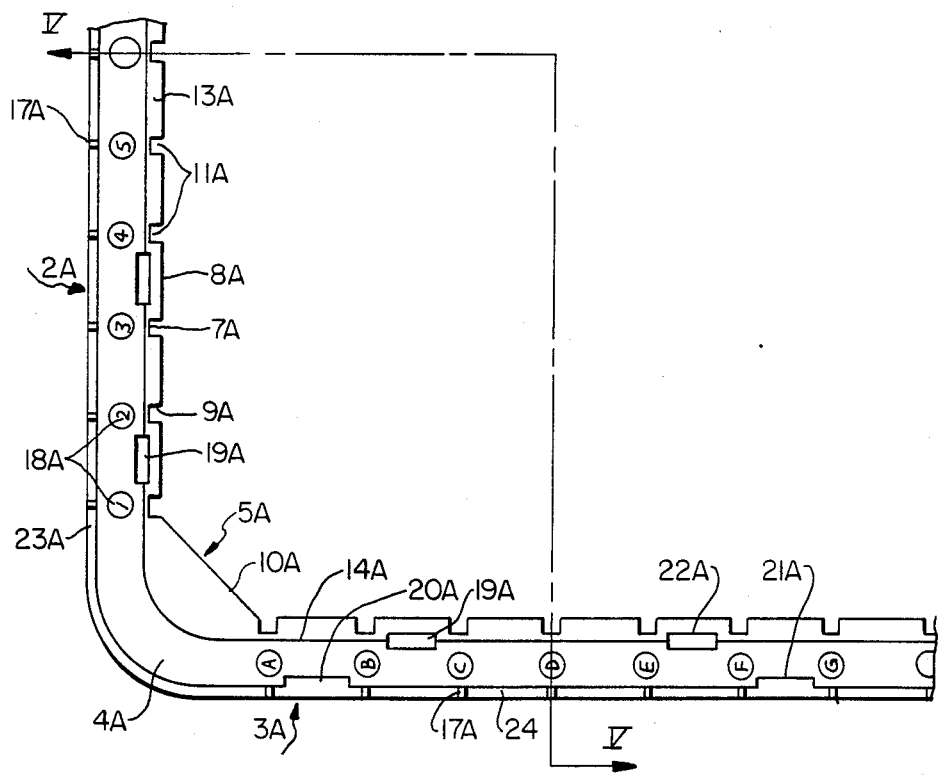
FIG. 4 is a top plan view of one quarter of an extension ring constructed according to the present invention, with the rectangular ring having remaining portions similarly constructed.
Figure 5:
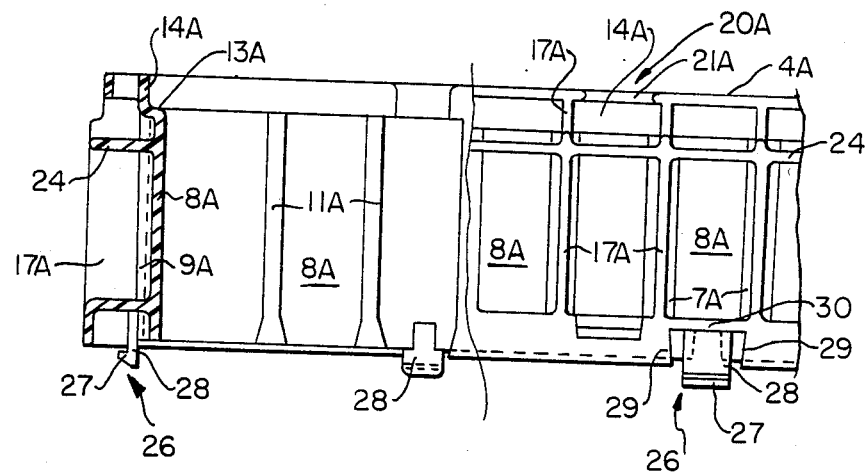
FIG. 5 is a side elevational view of the ring of FIG. 4, showing the outside of the ring to the right, the inside of the ring to the left, with respect to the sides, and a cross section of the ring end as shown to the far left, all as would be seen with respect to the break line V—V.
Figure 6:
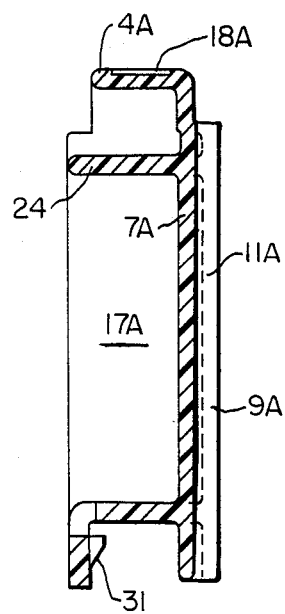
FIG. 6 is a cross-sectional elevational view taken only through the side of the ring along a corresponding portion of line V—V in FIG. 4.
Figure 7:
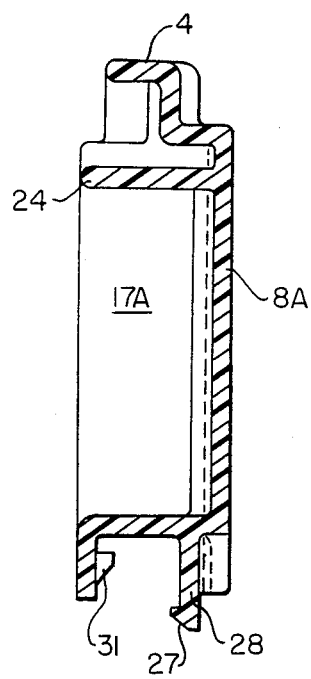
FIG. 7 is a cross-sectional elevation view similar to FIG. 6, but taken through an interlocking element 21a, in a plane parallel to that of FIG. 6.
Figure 8:
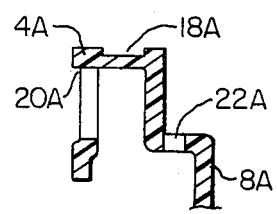
FIG. 8 is a partial cross-sectional view through the top of the base box taken along line VIII—VIII of FIG. 1.
Figure 9:
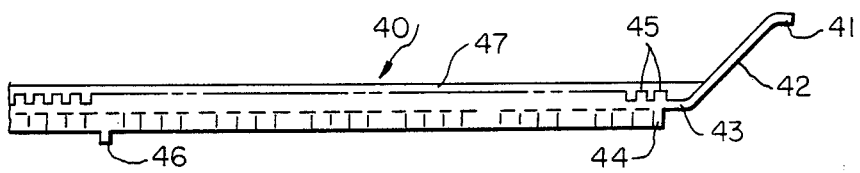
FIG. 9 is a top plan view of one half of a partition plate, the other half being correspondingly identical.
Figure 10:
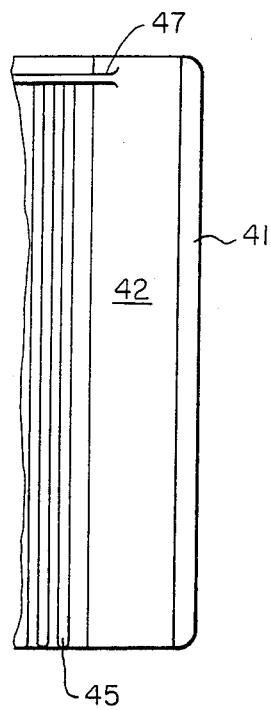
FIG. 10 is a partial elevational view of the partition plate of FIG. 9.
Figure 11:
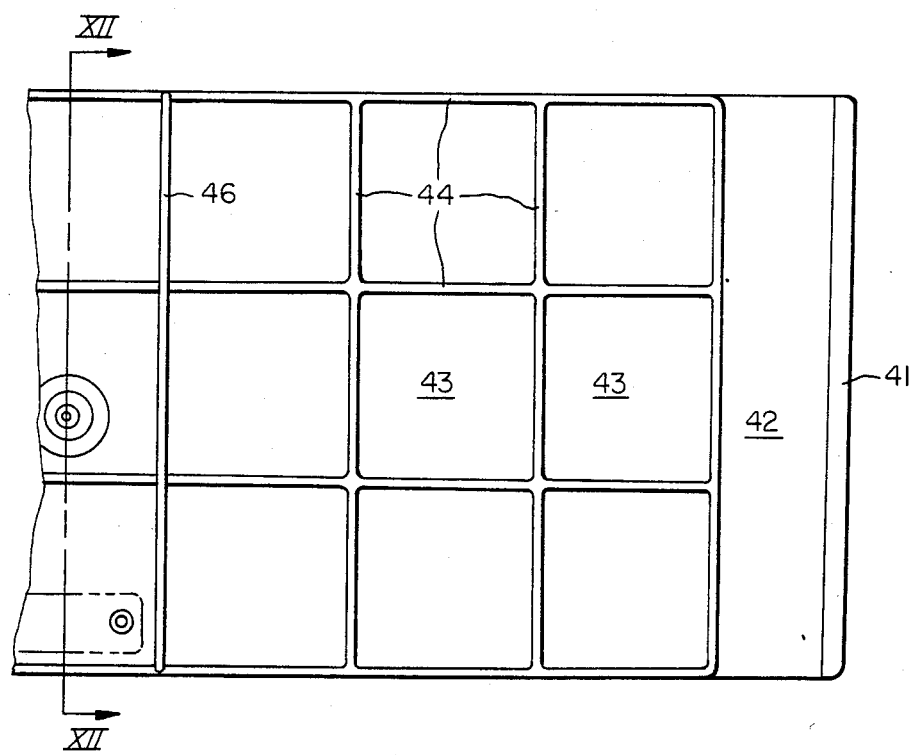
FIG. 11 is an elevation view of the partition plate of FIG. 9, taken from the opposite side of that of FIG. 10.
Figure 12:
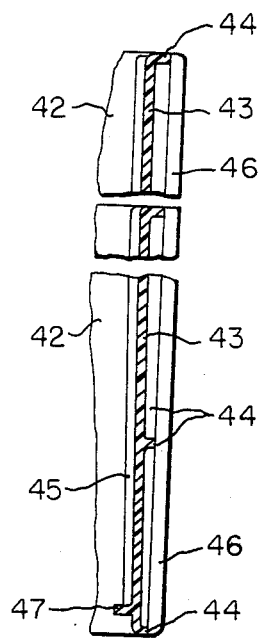
FIG. 12 is a cross-sectional view taken along line XII—XII in FIG. 11.

As seen from FIGS. 4, 5, 6 and 7, the extension ring is likewise constructed of integrally molded elements. The ring has opposed side walls 3A and end walls 2A, but no bottom. With respect to elements that correspond to those of the base box, the same numerals are employed for the ring, but with the addition of "A". Therefore, a description of their structure and function will not be repeated with respect to the ring since the above description is equally applicable. In general, the connections between the side edges and end edges and their shape are such that the ring is rectangular and may be placed in alignment on the top of the base box so that the ring side walls and ring end walls will form substantially coplanar extensions of the corresponding base box sides and ends. The interlocking elements on the lower edge of the ring and the upper edge of the box base will interconnect the ring and base box securely sufficiently for their intended purpose, but temporary in the sense that the ring may be removed and used on another box. The ring has a horizontal flange 24 somewhat similar to the flange 23 and flange 16 of the base box. For the base box, the interlocking elements comprise an aperture 20 in the skirt flange having a downwardly facing locking edge 21 for the side walls and merely the downwardly facing edge of the top horizontal flange for the end walls, which structure is interchangeable as between the sides and ends. Also separate interlocking elements are formed on the base box by apertures 19 that are in the horizontal flange 13 as well as the upper horizontal flange and the vertical flange 14. More preferably, the vertical flange 14 is not merely cut away, but rather recessed at this position to provide a downwardly facing flange at 22 as shown in FIG. 8. This same structure is to be found along the top edge of the ring as shown in FIG. 4, so that another ring could actually be attached to the top of the first ring.

The interlocking elements for the ring will now be described. A pair of hooks 26, 31 downwardly extend from the lower perimeter of the ring at a plurality of locations on the side walls and end walls, to correspondingly vertically align with the interlocking elements of the base box. That is, pairs of hooks will be spaced apart from each other in a direction perpendicular to their wall, as shown in FIG. 7 a distance sufficient to receive therebetween the interlocking elements of the base box. The interlocking element 6 comprises a cantilevered resilient downwardly depending flange 28 terminating in a return hook portion 27 at its terminal lower end. The apertures, recesses or slots 19, 20 of the base box are spaced apart a distance less than the distance between the hook portions 31, 27 and therefore the hook portions are provided with wedging or camming surfaces as most specifically shown in FIG. 7 to engage the side walls of the slots as the hook portions move through the slots to resiliently bend the cantilevered flanges to force the hook portions into the slots to pass through the slots, so that after passing through the slots the hook portions will snap back behind the slot walls and engage beneath the edges 21, 22 to securely hold the ring on the base box.

Figure 1:
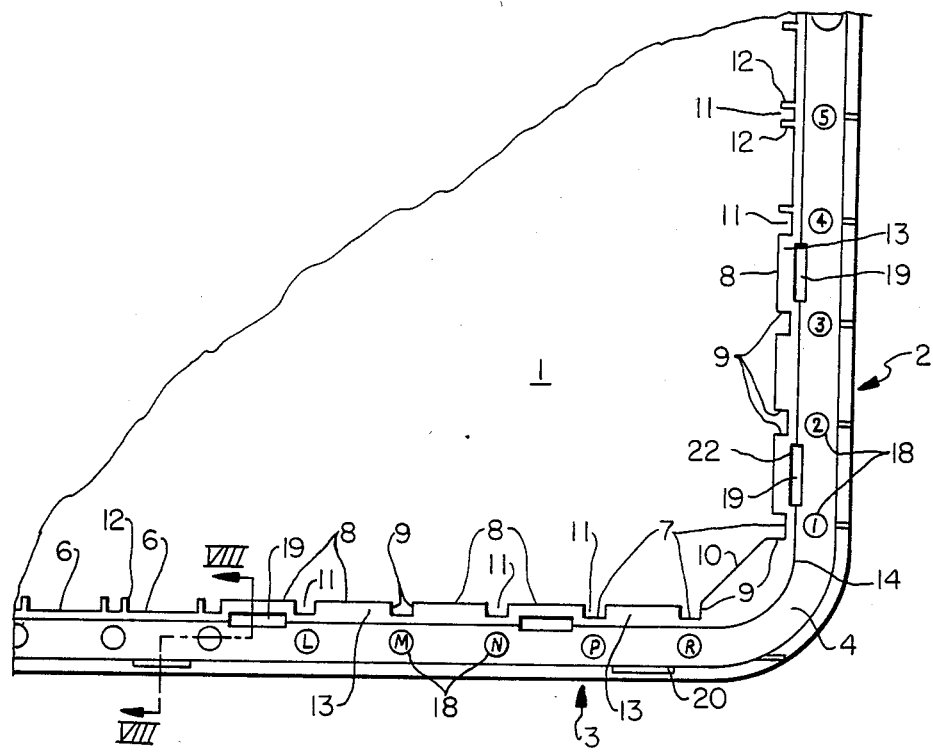
FIG. 1 is a top plan view of one quarter of a box base constructed according to the present invention, with the remainder of the rectangular box being correspondingly constructed.
Figure 2:
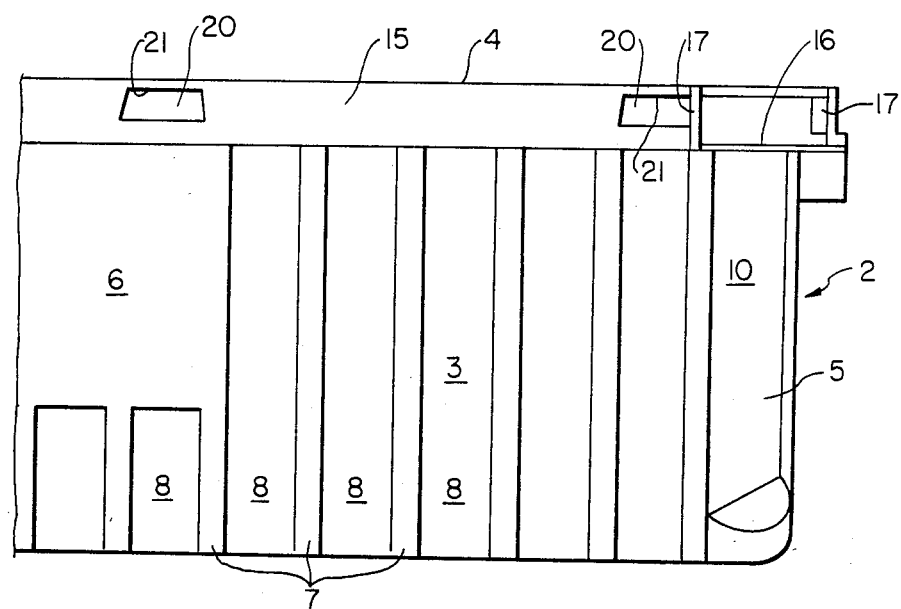
FIG. 2 is a side elevational view of the box portion of FIG. 1.

For molding convenience and to minimize weakening of the ring bottom periphery and the top periphery of both the ring and the base box, the inside interlocking elements 19, 26 are peripherally offset from the paired outside interlocking elements 20, 31, in a horizontal direction within the plane of the respective wall sufficiently so that the slots of each opposed pair do not overlap each other, as more particularly shown in FIGS. 1 and 4.

Since the ring has interlocking elements substantially identical to the interlocking elements of the base box, in vertical alignment with the corresponding interlocking elements of the base box, a second like ring may be placed upon and securely fastened to the upper periphery of the first mentioned ring to further extend the base box. As an example of a box system, three boxes may be molded in sizes differing only in height, with a difference between boxes being five inches. If for example, the bottom box is five inches high, the next boxes will be ten and fifteen inches high. With an effective height of the ring being three inches, these box sizes may be expanded to eight, thirteen and eighteen inches respectively, which boxes may be further expanded by the use of a second ring to eleven, sixteen and twenty-one inches respectively. Other combinations and sizes are contemplated, and further other size rings could be employed, that is multiple size rings would further change the inventory of box sizes in an efficient manner.

When the ring is assembled onto the base box, the slots 11 will extend for the full height above the box and ring, in vertical alignment, throughout the periphery of the interior of the box and ring.

Figure 15:
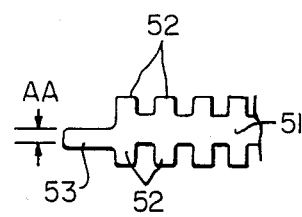
FIG. 15 is a top plan view of a portion of the board holder taken from line XV—XV in FIG. 14.

Partition plates 40 as shown in FIGS. 9-12 have opposite vertically extending edges 41, which edges may be engaged respectively in the slots 11 of the base box that are closest to the corners 10. The divider plates further have corner portions 42 that will extend along and parallel to the corner portions 10 of the base box, which lead to a planar base portion 43 that would extend parallel to and closely adjacent the sides of the box, with a pair of such partition plates being provided along opposite sides of the box and identical to each other. A plurality of reinforcing ribs 44 are preferably provided in a grid pattern for reinforcing the base 43, and most preferably an interlocking rib 46 is provided to engage within one of the slots 11 of the side of the base box. On the side of the base 43 opposite from the ribs 44, 46, there are provided a plurality of vertically extending parallel ribs 45 evenly spaced throughout the extent of the base 43, to provide therebetween vertically extending slots for receiving the edges of circuit board holders or like objects. Closing off the lower end or upper end, but not both, of all of the slots between the ribs 45, there is a horizontal rib 47. This rib 47 may be used as a lower stop to keep the now to be described board holders from engaging the bottom of the box and/or prevent the board holders from readily being removed upwardly out of the slots. Alternatively, they may be omitted. A plurality of board holders, in sufficient number, one being shown in FIGS. 14–15, may be inserted parallel to each other and perpendicular to the base 43 so as to extend between opposed slots of the partition plates. More specifically, the board holders 50 are provided with a planar base 51 having substantially identical opposite sides comprising a plurality of parallel ribs 52. The ribs 52 are evenly spaced from each other throughout the corresponding sides of the base 51 to present therebetween the corresponding plurality of equally sized and spaced outwardly opening vertical slots for receiving therein the edges of circuit boards. The circuit boards are not shown, but are of conventional design. The opposite vertical edges 53 of the board holders are offset in a direction perpendicular to the base 51 from the central plane of the base 51 by an amount AA, as shown in FIG. 15, so that if the board holder were inserted into opposed slots of the partition plates, removed, rotated 180° about a vertical axis and reinserted in the same slots, the effective position of the board holder slots would be shifted perpendicular to the base 51 by a corresponding amount. This shifting amount is preferably less than the shifting amount that would be produced by merely taking the board holder out of a pair of opposed slots and reinserting it in the next pair of opposed slots of the partition plates. That is, the offset provides an additional adjustment for spacing between parallel board holders. In this manner, any number of board holders may be inserted between the partition plates and have their spacing accurately and incrementally adjusted in small amounts to accommodate circuit boards therebetween. Since generally the assembly of such board holders, partition plates and circuit boards is known within a similar type of slotted box, it will not be further shown or described in detail.

While a preferred embodiment has been described structurally and functionally in detail for the advantages thereof, other embodiments, modifications and variations are contemplated within the broad aspects of the present invention, all is defined by the spirit and scope of the following claims.

We claim:

1. A modular box system, comprising:
    a base box constructed in one piece of molded synthetic resin, having a bottom, opposed sides sloping upwardly and outwardly from said bottom, opposed ends sloping upwardly and outwardly from said bottom, and said ends respectively connected at side edges to corresponding side edges of said sides to form an open top box that may be nested within like open topped boxes;
    a molded synthetic resin ring, separate from said base box, having opposed side walls and opposed end walls connected at their side edges to corresponding side edges of said side walls to be of a size and shape so that when placed in alignment on top of said base box, the ring side walls and end walls will form substantially coplanar extensions of the corresponding base box sides and ends;
    interlocking elements respectively on the lower edge of said ring in the upper edge of said base box for interconnecting said ring and base box securely; and
    said interlocking elements on one of said base box and ring, comprising opposed pairs of hooks spaced apart from each other in a direction perpendicular to their wall a distance sufficient to receive therebetween the interlocking elements of the other of said base box and ring.

2. A modular box according to claim 1, wherein said hooks have a cantilevered resilient flange extending toward the other of said base box and ring with a return hook portion on its terminal end.

3. A modular box according to claim 2, wherein the other of said base box and ring having slots formed by slot walls, for receiving therethrough said cantilevered resilient flanges, said slots being spaced apart a distance less than the distance between said hook portions, and said hook portions having cam means to engage said slots as said hook portions move through said slots to resiliently bend said cantilevered flanges to force said hook portions in alignment with said slots to pass through said slots so that said hook portions may snap back behind said slot walls.

4. A modular box according to claim 3, wherein for each pair of opposed hooks and pair of slots, said hooks and slots being offset from each other in a horizontal direction within the plane of the respective wall sufficiently so that the slots of each opposed pair do not overlap each other.

5. A modular box according to claim 1, including said ring further having interlocking elements substantially identical to the interlocking elements of said base box, in vertical alignment with the corresponding interlocking elements of said box, so that a second like ring may be placed upon and securely fastened to the upper periphery of said first mentioned ring to further extend said base box.

6. A modular box according to claim 1, wherein said sides and ends of said base box have vertically extending substantially evenly spaced slots opening inwardly of the box, generally throughout the periphery of the interior of said base box, for substantially the full height of said walls for receiving therein partitions for partitioning the interior of said base box; and
    said ring having vertically extending substantially evenly spaced slots opening inwardly and generally throughout the periphery of the interior of said base box for substantially the full height of said walls for receiving therein partitions for partitioning the interior of said base box and so that the slots of said base box are vertically aligned with the slots of said ring when assembled.

7. A modular box according to claim 6, including two substantially identical partition plates having opposite vertically extending edges for engaging in opposed slots of said base box, and having a plurality of vertically extending slots parallel to each other and facing outwardly perpendicular to the slots receiving therein said edges, with said partition slots being more closely spaced than the slots of said base box, so that two partition plates placed parallel to each other within said box base will have opposed aligned spaced apart slots.

8. A modular box according to claim 7, including a plurality of board holders being of generally planar construction with opposed vertical edges for reception within opposed vertical slots of said partition plates and having a plurality of closely spaced vertically extending slots along its entire extent between said edges on at least one side.

9. A modular box according to claim 8, wherein said board holders have closely spaced vertical slots extending along its opposite sides.

10. A modular box according to claim 9, wherein said opposed edges of said board holders are horizontally offset in a direction perpendicular to the planar extent of said board holder an amount such that said board holder may be vertically removed, rotated about a vertical axis 180° and vertically reassembled in the same vertical opposed slots of said partition plates to incrementally move the parallel slots of the board holder from its previous position a substantial amount that is less than the spacing between adjacent slots of said partition plates.

11. A modular box according to claim 10, wherein said substantial amount is equal to one half the spacing between adjacent slots in said partition later.

12. A modular box according to claim 11, wherein said synthetic resin is an electrostatic dissipating material.

13. A modular box system, comprising:
a base box constructed in one piece of molded synthetic resin, having a bottom, opposed sides sloping upwardly and outwardly from said bottom, opposed ends sloping upwardly and outwardly from said bottom, and said ends respectively connected at side edges to corresponding side edges of said sides to form an open top box that may be nested within like open topped boxes;
said sides and ends of said base box having vertically extending substantially evenly spaced slots opening inwardly of the box, generally throughout the periphery of the interior of said base box, for substantially the full height of said walls for receiving therein partitions for partitioning the interior of said base box;
two substantially identical partition plates having opposite vertically extending edges for engaging in opposed slots of said base box, and having a plurality of vertically extending slots parallel to each other and facing outwardly perpendicular to the slots receiving therein said edges, with said partition slots being more closely spaced than the slots of said base box, so that two partition plates placed parallel to each other within said box base will have opposed aligned spaced apart slots;
a plurality of board holders being of generally planar construction with opposed vertical edges for reception within opposed vertical slots of said partition plates and having a plurality of closely spaced vertically extending slots along its entire extent between said edges on at least one side;
said board holders have closely spaced vertical slots extending along its opposite sides; and
said opposed edges of said board holders being horizontally offset in a direction perpendicular to the planar extent of said board holder an amount such that said board holder may be vertically removed, rotated about a vertical axis 180° and vertically reassembled in the same vertical opposed slots of said partition plates to incrementally move the parallel slots of the board holder from its previous position a substantial amount that is less than the spacing between adjacent slots of said partition plates.

14. A modular box according to claim 13, wherein said substantial amount is equal to one half the spacing between adjacent slots in said partition later.

15. A modular box according to claim 14, wherein said synthetic resin is an electrostatic dissipating material.

16. A modular box system, comprising:
a base box constructed in on piece of molded synthetic resin, having a bottom, opposed sides sloping upwardly and outwardly from said bottom, opposed ends sloping upwardly and outwardly from said bottom, and said ends respectively connected at side edges to corresponding side edges of said sides to form an open top box that may be nested within like open topped boxes;
a molded synthetic resin ring, separate from said base box, having opposed side walls and opposed end walls connected at their side edges to corresponding side edges of said side walls to be of a size and shape so that when placed in alignment on top of said base box, the ring side walls and end walls will form substantially coplanar extensions of the corresponding base box sides and ends;
interlocking elements respectively on the lower edge of said ring in the upper edge of said base box for interconnecting said ring and base box securely; and
a plurality of said base boxes differing substantially only in height, and the difference in height between base boxes being substantially different than the effective height of said rings in extending said base boxes whereby a single size ring may extend each size of the base boxes to an assembled size different from the size of any of the other boxes.

17. A modular box according to claim 16, wherein said base boxes differ in size sufficiently so that two rings securely assembled on any box base will extend it to a size different from the size of any other box base.

18. A modular box according to claim 17, including a plurality of like rings, differing from each other substantially only in height to extend said base boxes correspondingly different amounts.

19. A modular box according to claim 16, including a plurality of like rings, differing from each other substantially only in height to extend said base boxes correspondingly different amounts.

20. A modular box according to claim 19, wherein said interlocking elements on one of said base box and ring, comprise opposed pairs of hooks spaced apart from each other in a direction perpendicular to their wall a distance sufficient to receive therebetween the interlocking elements of the other of said base box and ring;

said hooks have a cantilevered resilient flange extending toward the other of said base box and ring with a return hook portion on its terminal end;

the other of said base box and ring having slots formed by slot walls, for receiving therethrough said cantilevered resilient flanges, said slots being spaced apart a distance less than the distance between said hook portions, and said hook portions having cam means to engage said slots as said hook portions move through said slots to resiliently bend said cantilevered flanges to force said hook portions in alignment with said slots to pass through said slots so that said hook portions may snap back behind said slot walls;

for each pair of opposed hooks and pair of slots, said hooks and slots being offset from each other in a horizontal direction within the plane of the respective wall sufficiently so that the slots of each opposed pair do not overlap each other;

said ring further having interlocking elements substantially identical to the interlocking elements of said base box, in vertical alignment with the corresponding interlocking elements of said box, so that a second like ring may be placed upon and securely fastened to the upper periphery of said first mentioned ring to further extend said base box;

said sides and ends of said base box having vertically extending substantially evenly spaced slots opening inwardly of the box, generally throughout the periphery of the interior of said base box, for substantially the full height of said walls for receiving therein partitions for partitioning the interior of said base box;

said ring having vertically extending substantially evenly spaced slots opening inwardly and generally throughout the periphery of the interior of said base box for substantially the full height of said walls for receiving therein partitions for partitioning the interior of said base box and so that the slots of said base box are vertically aligned with the slots of said ring when assembled;

two substantially identical partition plates having opposite vertically extending edges for engaging in opposed slots of said base box, and having a plurality of vertically extending slots parallel to each other and facing outwardly perpendicular to the slots receiving therein said edges, with said partition slots being more closely spaced than the slots of said base box, so that two partition plates placed parallel to each other within said box base will have opposed aligned spaced apart slots;

a plurality of board holders being of generally planar construction with opposed vertical edges for reception within opposed vertical slots of said partition plates and having a plurality of closely spaced vertically extending slots along its entire extent between said edges on at least one side;

said board holders have closely spaced vertical slots extending along its opposite sides;

said opposed edges of said board holders being horizontally offset in a direction perpendicular to the planar extent of said board holder an amount such that said board holder may be vertically removed, rotated about a vertical axis 180° and vertically reassembled in the same vertical opposed slots of said partition plates to incrementally move the parallel slots of the board holder from its previous position a substantial amount that is less than the spacing between adjacent slots of said partition plates;

said substantial amount is equal to one half the spacing between adjacent slots in said partition later; and said synthetic resin is an electrostatic dissipating material.

* * * * *